(12) United States Patent
Xin et al.

(10) Patent No.: US 12,041,804 B2
(45) Date of Patent: Jul. 16, 2024

(54) DISPLAY PANEL AND DISPLAY DEVICE WITH CATHODE LAYER HAVING IRREGULARLY-SHAPED EDGE

(71) Applicant: Xiamen Tianma Micro-Electronics Co., Ltd., Xiamen (CN)

(72) Inventors: Yu Xin, Shanghai (CN); Lijing Han, Shanghai (CN); Bing Han, Shanghai (CN); Zuhua Li, Shanghai (CN)

(73) Assignee: Xiamen Tianma Micro-Electronics Co., Ltd., Xiamen (CN)

(*) Notice: Subject to any disclaimer, the term of this patent is extended or adjusted under 35 U.S.C. 154(b) by 504 days.

(21) Appl. No.: 17/234,162

(22) Filed: Apr. 19, 2021

(65) Prior Publication Data

US 2022/0255037 A1 Aug. 11, 2022

(30) Foreign Application Priority Data

Feb. 5, 2021 (CN) .......................... 202110158372.7

(51) Int. Cl.
*H10K 50/822* (2023.01)
*H10K 50/84* (2023.01)
*H10K 59/131* (2023.01)

(52) U.S. Cl.
CPC .......... *H10K 50/822* (2023.02); *H10K 50/84* (2023.02); *H10K 59/131* (2023.02)

(58) Field of Classification Search
CPC ..... H10K 50/822; H10K 50/84; H10K 59/131
See application file for complete search history.

(56) References Cited

U.S. PATENT DOCUMENTS

| | | | |
|---|---|---|---|
| 2012/0032927 A1* | 2/2012 | Kim | G06F 3/045 345/176 |
| 2014/0327840 A1* | 11/2014 | Kim | G02F 1/13338 438/30 |
| 2018/0069054 A1* | 3/2018 | Zhai | G06F 3/041 |
| 2019/0393448 A1* | 12/2019 | Choi | H10K 50/858 |
| 2022/0006041 A1* | 1/2022 | Seo | H10K 50/822 |

FOREIGN PATENT DOCUMENTS

| | | |
|---|---|---|
| CN | 106981585 A | 7/2017 |
| CN | 107425033 A | 12/2017 |
| CN | 109671865 A | 4/2019 |
| CN | 110164949 A | 8/2019 |

* cited by examiner

*Primary Examiner* — Lex H Malsawma
(74) *Attorney, Agent, or Firm* — Anova Law Group, PLLC

(57) ABSTRACT

A display panel with a display region and a non-display region includes a base substrate; a device layer, disposed on one side of the base substrate, covering the display region, and including a cathode layer; and an encapsulation part, arranged around the device layer in the non-display region and including a metal pad layer surrounding the cathode layer. The metal pad layer and the cathode layer are separated by a gap. The cathode layer has a first irregularly-shaped edge, including first deformed portions and second deformed portions that are alternately distributed. Each first deformed portion extends convexly in a direction toward the metal pad layer, and each second deformed portion extends concavely in a direction away from the metal pad layer. In an extending direction of the first irregularly-shaped edge, a length of the first deformed portion is less than or equal to a length of the second deformed portion.

20 Claims, 10 Drawing Sheets

DISPLAY PANEL AND DISPLAY DEVICE WITH CATHODE LAYER HAVING IRREGULARLY-SHAPED EDGE

CROSS-REFERENCES TO RELATED APPLICATIONS

This application claims the priority of Chinese patent application No. 202110158372.7, filed on Feb. 5, 2021, the entirety of which is incorporated herein by reference.

FIELD OF THE DISCLOSURE

The present disclosure generally relates to the field of display technology and, more particularly, relates to a display panel and a display device.

BACKGROUND

Currently, display panels with narrow frames have gradually become the mainstream of displays. For organic light-emitting diode (OLED) rigid display products, packaging glue is required. Due to the limitations of the frame width and process of display panels, when the cathode layer of the display panel is made, the material of the cathode layer may be easily evaporated onto the underlayer metal of the encapsulant, which affects the adhesion of the package and causes the package to fail. At the same time, a green line is generated at the edge, thereby affecting the overall black appearance of the display panel.

The disclosed display panel and display device are directed to solve one or more problems set forth above and other problems in the art.

BRIEF SUMMARY OF THE DISCLOSURE

One aspect of the present disclosure provides a display panel with a display region and a non-display region. The display panel includes a base substrate; a device layer, disposed on one side of the base substrate, covering the display region, and including a cathode layer; and an encapsulation part, arranged around the device layer in the non-display region and including a metal pad layer surrounding the cathode layer. The metal pad layer and the cathode layer are separated by a gap. The cathode layer has a first irregularly-shaped edge, including first deformed portions and second deformed portions that are alternately distributed. Each first deformed portion extends convexly in a direction toward the metal pad layer, and each second deformed portion extends concavely in a direction away from the metal pad layer. In an extending direction of the first irregularly-shaped edge, a length of the first deformed portion is less than or equal to a length of the second deformed portion.

Another aspect of the present disclosure provides a display device, including a display panel with a display region and a non-display region. The display panel includes a base substrate; a device layer, disposed on one side of the base substrate, covering the display region, and including a cathode layer; and an encapsulation part, arranged around the device layer in the non-display region and including a metal pad layer surrounding the cathode layer. The metal pad layer and the cathode layer are separated by a gap. The cathode layer has a first irregularly-shaped edge, including first deformed portions and second deformed portions that are alternately distributed. Each first deformed portion extends convexly in a direction toward the metal pad layer, and each second deformed portion extends concavely in a direction away from the metal pad layer. In an extending direction of the first irregularly-shaped edge, a length of the first deformed portion is less than or equal to a length of the second deformed portion.

Other aspects of the present disclosure can be understood by those skilled in the art in light of the description, the claims, and the drawings of the present disclosure.

BRIEF DESCRIPTION OF THE DRAWINGS

In order to explain the technical solutions of the embodiments of the present disclosure more clearly, the following will briefly introduce the drawings that need to be used in the embodiments of the present disclosure. Obviously, the drawings described below are only some embodiments of the present disclosure, and a person with ordinary skills in the art can obtain other drawings based on these drawings without creative work.

DETAILED DESCRIPTION

The features and exemplary embodiments of various aspects of the present disclosure will be described in detail below. In the following detailed description, many specific details are proposed in order to provide a comprehensive understanding of the present disclosure. However, it is obvious to those skilled in the art that the present disclosure can be implemented without some of these specific details. The following description of various embodiments is merely for providing a better understanding of the present disclosure with examples.

It should be noted that in the present disclosure, relational terms such as first and second are only used to distinguish one entity or operation from another entity or operation, and do not necessarily require or imply that there is any such actual relationship or order between these entities or operations. Moreover, the terms "comprise", "include" or any other variants thereof are intended to cover non-exclusive inclusion, so that a process, method, article, or device including a series of elements not only includes those elements, but also includes other elements that are not explicitly listed, or also includes elements inherent to this process, method, article, or device. Without further restrictions, elements defined by the sentence "including . . . " do not exclude the existence of other identical elements in the process, method, article, or device that includes the elements.

In order to better understand the present disclosure, the display panel and the display device according to the embodiments of the present disclosure will be described in detail below with reference to FIGS. 1-11.

Figure 1:
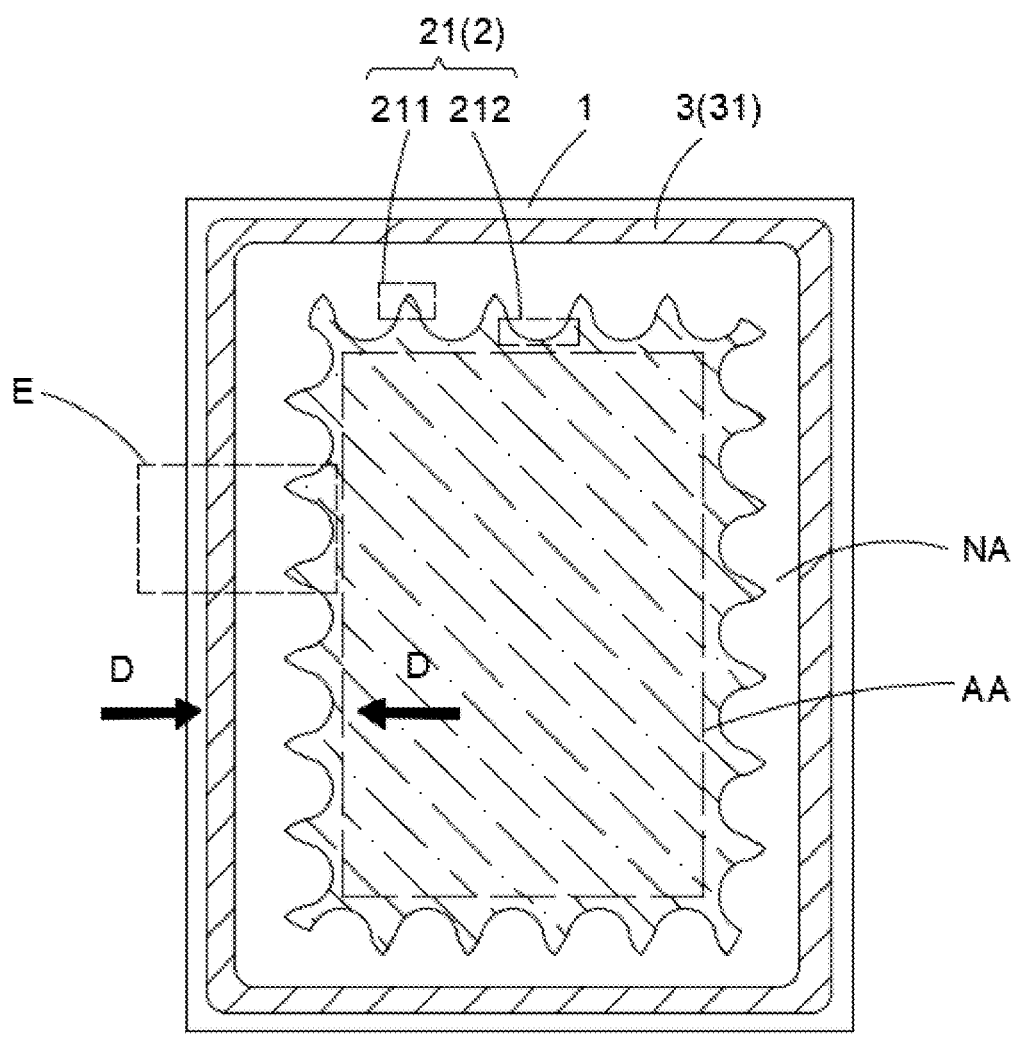
FIG. 1 illustrates a schematic structural diagram of an exemplary display panel according to various embodiments of the present disclosure.
Figure 2:
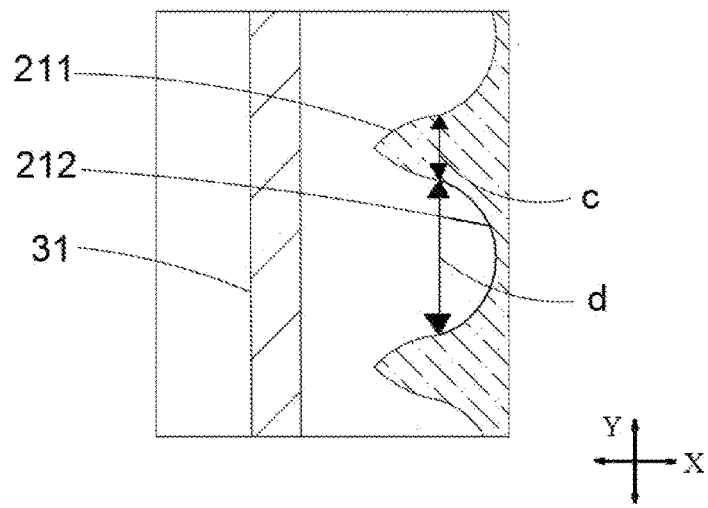
FIG. 2 illustrates an enlarged view of a part at E in FIG. 1.
Figure 3:
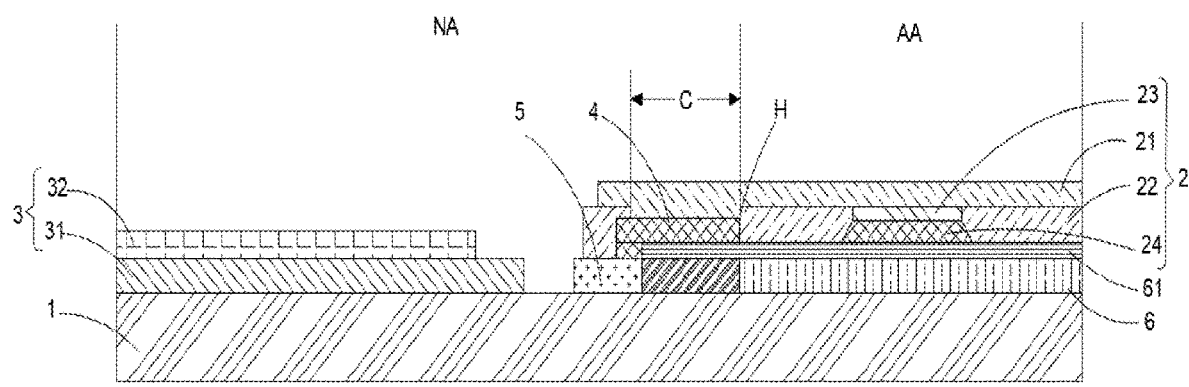
FIG. 3 illustrates a schematic diagram of a film structure at D-D in FIG. 1.

FIG. 1 illustrates a schematic structural diagram of an exemplary display panel according to various embodiments of the present disclosure, FIG. 2 illustrates an enlarged view of a part at E in FIG. 1, and FIG. 3 illustrates a schematic diagram of a film structure at D-D in FIG. 1. Referring to FIGS. 1-3, the present disclosure provides a display panel. The display panel may include a display region AA, and a non-display region NA. The non-display region NA may surround the display region AA. The display panel may include a base substrate 1; a device layer 2, disposed on one side of the base substrate 1, covering the display region AA, and including a cathode layer 21; and an encapsulation part 3, arranged around the device layer in the non-display region NA and including a metal pad layer 31 surrounding the cathode layer 21. There is a gap between the metal pad layer 31 and the cathode layer 21. The cathode layer 21 may have a first irregularly-shaped edge, and the first irregularly-shaped edge may include alternately distributed first deformed portions 211 and second deformed portions 212. Each first deformed portion 211 may extend convexly in the direction toward the metal pad layer 31, and each second deformed portion 212 may extend concavely in the direction away from the metal pad layer 31. In the extending direction Y of the first irregularly-shaped edge, the length c of the first deformed portion 211 may be less than or equal to the length d of the second deformed portion 212.

According to the fabrication process, the preparation of the display panel may include forming the cathode layer 21 by evaporation. The step of evaporating the cathode layer may require the use of a mask plate 7. The mask plate 7 may be provided with openings, and the material evaporated from the evaporation source may be deposited on the base substrate 1 through the openings in the mask plate 7 to form the cathode layer 21 accordingly. However, during vapor deposition, due to the gap between the mask plate 7 and the base substrate 1, the cathode layer 21 formed through the deposition process using the mask plate may often have a size larger than the designed size of the cathode layer 21. For example, the width of the cathode layer 21 may be set to x and the length may be set to y. When the size of the hole on the mask plate 7 is the same as the designed size of the cathode layer 21, because a gap exists between the mask plate 7 and the base substrate 1 during the evaporation process of forming the cathode layer 21 on the base substrate 1 using the mask plate 7, the width of the actually produced cathode layer 21 may be greater than x and the length may be greater than y. This phenomenon is called the shadow effect. Affected by the shadow effect and process deviation, the cathode layer 21 may be easily evaporated on the metal pad layer 31, thereby affecting the packaging effect of the display panel.

The display panel provided by various embodiments of the present disclosure may include a display region AA and a non-display region NA. In addition, the display panel may include a base substrate 1, a device layer 2, and an encapsulation part 3. A gap may be formed between a cathode layer 21 of the device layer and a metal pad layer 31 of the encapsulation part 3. The cathode layer 21 may have a first irregularly-shaped edge. For example, the first irregularly-shaped edge may be the side edge of the cathode layer 21 adjacent to the metal pad layer 31. The first irregularly-shaped edge may include alternately distributed first deformed portions 211 and second deformed portions 212. The extending directions of the first deformed portion 211 and the second deformed portion 212 may be different. The first deformed portion 211 may extend convexly in the direction toward the metal pad layer 31, and the second deformed portion 212 may extend concavely away from the metal pad layer 31. Therefore, compared to the distance between the first deformed portion 211 and the metal pad layer 31, the distance between the second deformed portion 212 and the metal pad layer 31 may be larger, thereby preventing the entire edge of the cathode layer from being evaporated on the metal pad layer 31. In addition, along the extending direction Y of the first irregularly-shaped edge, the length c of the first deformed portion 211 may be less than or equal to the length d of the second deformed portion 212. That is, the length d of the second deformed portion 212 that is relatively far away from the metal pad layer 31 may be ensured to be larger than or equal to the length c of the first deformed portion 211 that is relatively closer to the metal pad layer 31. As such, the possibility of evaporating the cathode layer 21 on the metal pad layer 31 due to the shadow effect and process deviation may be reduced, and the packaging reliability of the encapsulation part 3 may be improved. Moreover, green line at the edges may be avoided, ensuring the overall black appearance of the display panel.

In one embodiment, in the extending direction Y along the first irregularly-shaped edge, the length c of the first deformed portion 211 may be smaller than the length d of the second deformed portion 212. That is, on the first irregularly-shaped edge, the occupied percentage by the second deformed portion 212 that is away from the metal pad layer 31 may be larger than the occupied percentage by the first deformed portion 211 that is adjacent to the metal pad layer 31. Therefore, even when the vapor deposition is deviated, the evaporated material may have a greater possibility of being evaporated between the second deformed portion 212 and the metal pad layer 31 instead of falling on the metal pad layer 31 opposite to the first deformed portion 211. As such, the possibility of evaporating the cathode layer 21 onto the metal pad layer 31 due to shadow effect and process deviation may be reduced.

It should be noted that the device layer 2 may be disposed on the side of the base substrate 1 and may cover the display region AA. For example, the device layer may be disposed at least in the display region AA. In one embodiment, the cathode layer 21 of the device layer 2 may be partially located in the display region AA, and partially extend from the display region AA to the non-display region NA to facilitate the connection with a cathode signal line. The first irregularly-shaped edge of the cathode layer 21 may be located in the non-display region NA, and may be arranged opposite to the metal pad layer 31.

The first deformed portions 211 and the second deformed portions 212 may be alternately distributed. For example, the first deformed portions 211 and the second deformed portions 212 may be arranged in one-to-one correspondence following an order of a first deformed portion 211, a second deformed portion 212, a first deformed portion 211, a second deformed portion 212, etc. the first deformed portion 211 may extend convexly in the direction toward the metal pad layer 31, and the second deformed portion 212 may extend concavely in the direction away from the metal pad layer 31. That is, instead of being a straight edge, the first irregularly-shaped edge may be a curved or a broken line containing concave or convex portions in different directions. The concave or convex portions in different directions may be determined by the shape and extending direction of the first deformed portions 211 and the second deformed portions 212.

In one embodiment, the cathode layer 21 and the metal pad layer 31 may be arranged in different layers and may be restricted by the structural components of the display panel. In the vertical direction Z perpendicular to the plane where the display panel is located, the cathode layer 21 may be higher than the metal pad layer 31. That is, the vertical distance between the cathode layer 21 and the base substrate 1 may be greater than the vertical distance between the metal pad layer 31 and the base substrate 1. In one embodiment, when the gap between the cathode layer 21 and the metal pad layer 31 is 60 µm, the process deviation of the opening on the mask plate 7 for the cathode layer 21 may be ±30 µm, and the evaporation size deviation caused by the shadow effect may be about 15 µm to 30 µm. In addition, a misalignment between the mask plate 7 and the base substrate 1 may also exist. Therefore, the cathode layer 21 may easily evaporated on the metal pad layer, so when the cathode layer 21 is evaporated, a first irregularly-shaped edge may need to be formed to prevent the material of the cathode layer 21 from being evaporated onto the metal pad layer 31 due to gravity and process deviation during evaporation and thus affecting the packaging effect of the display panel.

In one embodiment, in order to realize the packaging of the display panel, the encapsulation part 3 may further include a glass frit 32. When the display panel is packaged, a welding packaging process may be adopted. That is, a laser may be used to heat and melt the glass frit 32 to bond the base substrate 1 and the cover plate (not shown) of the display panel, so as to avoid the intrusion of water vapor and oxygen from outside and ensure the stability of the display performance. The glass frit 32 may be provided on the surface of the metal pad layer 31 facing away from the base substrate 1, and the metal pad layer 31 may be used for placing the glass frit 32. The metal pad layer 31 may be used to reflect the laser energy, so that the laser energy can be irradiated to the glass frit 32 as much as possible, thereby achieving desired adhesion effect and desired sealing effect.

It should be understood that, in order to realize the normal display function of the display panel, the device layer 2 may also include functional films such as an anode layer 24, a pixel defining layer 22, and an organic light-emitting layer 23 stacked in a vertical direction Z perpendicular to the plane where the display panel is located. The cathode layer 21 may cover the organic light-emitting layer 23. For example, the anode layer 24 and the cathode layer 21 may be made of conductive materials such as indium tin oxide (ITO), indium zinc oxide (IZO), or indium oxide. The pixel defining layer 22 may cover the edge of the anode. The pixel defining layer 22 surrounding the edge of the anode may define the pixel opening of the display panel. The pixel defining layer 22 may be made of an organic material such as polyimide, polyamide, benzocyclobutene, acrylic resin, or phenol resin. The organic light-emitting layer 23 may be located on the anode layer 24. The portion of the anode layer 24 on the upper surface of the base substrate 1 that is provided with the organic light-emitting layer 23 may not be covered and exposed by the pixel defining layer 22. The organic light-emitting layer 23 may be formed by an evaporation process. The organic light-emitting layer 23 may be made of an organic material with a low molecular weight. The organic light-emitting layer 23 may include at least one of a hole injection layer, a hole transport layer, an organic function layer, an electron transport layer, and a electron injection layer.

It should be understood that the base substrate 1 may be made of any suitable insulating material having flexibility. For example, the flexible base substrate 1 may be made of materials such as polyimide (PI), polycarbonate (PC), polyethersulfone (PES), polyethylene terephthalate (PET), polyethylene naphthalate (PEN), polyarylate (PAR) or glass fiber reinforced plastic (FRP), and other polymer materials. The base substrate 1 may be transparent, translucent, or opaque. Of course, the base substrate 1 may be a glass substrate. In this case, the display panel may be a rigid display panel that cannot be bent freely. In one embodiment, an array layer 6 may be provided between the device layer 2 and the base substrate 1, and the device layer may be provided on a planarization layer 61 of the array layer 6.

In some embodiments, the extension length of the first deformed portion 211 in the direction X toward the metal pad layer 31 may be less than or equal to the extension length of the second deformed portion 212 in the direction away from the metal pad layer 31.

It should be understood that the greater the extension length of the first deformed portion 211 in the direction X toward the metal pad layer 31, the closer the first deformed portion 211 of the cathode layer 21 to the metal pad layer 31, and the higher the risk of the cathode layer 21 being evaporated onto the metal pad layer 31. Similarly, the greater the extension length of the second deformed portion 212 in the direction away from the metal pad layer 31, the farther away the second deformed portion 212 of the cathode layer 21 from the metal pad layer 31, and the lower the risk of the cathode layer 21 being evaporated onto the metal pad layer 31. Therefore, the extension length of the first deformed portion 211 in the direction X toward the metal pad layer 31 may be set to be smaller than the extension length of the second deformed portion 212 in the direction away from the metal pad layer 31, thereby reducing the risk of evaporating the cathode layer 21 onto the metal pad layer 31. In one embodiment, the second deformed portion 212 away from the metal pad layer 31 and the first deformed portion 211 in the direction X toward the metal pad layer 31 may be parallel to each other.

Figure 4:
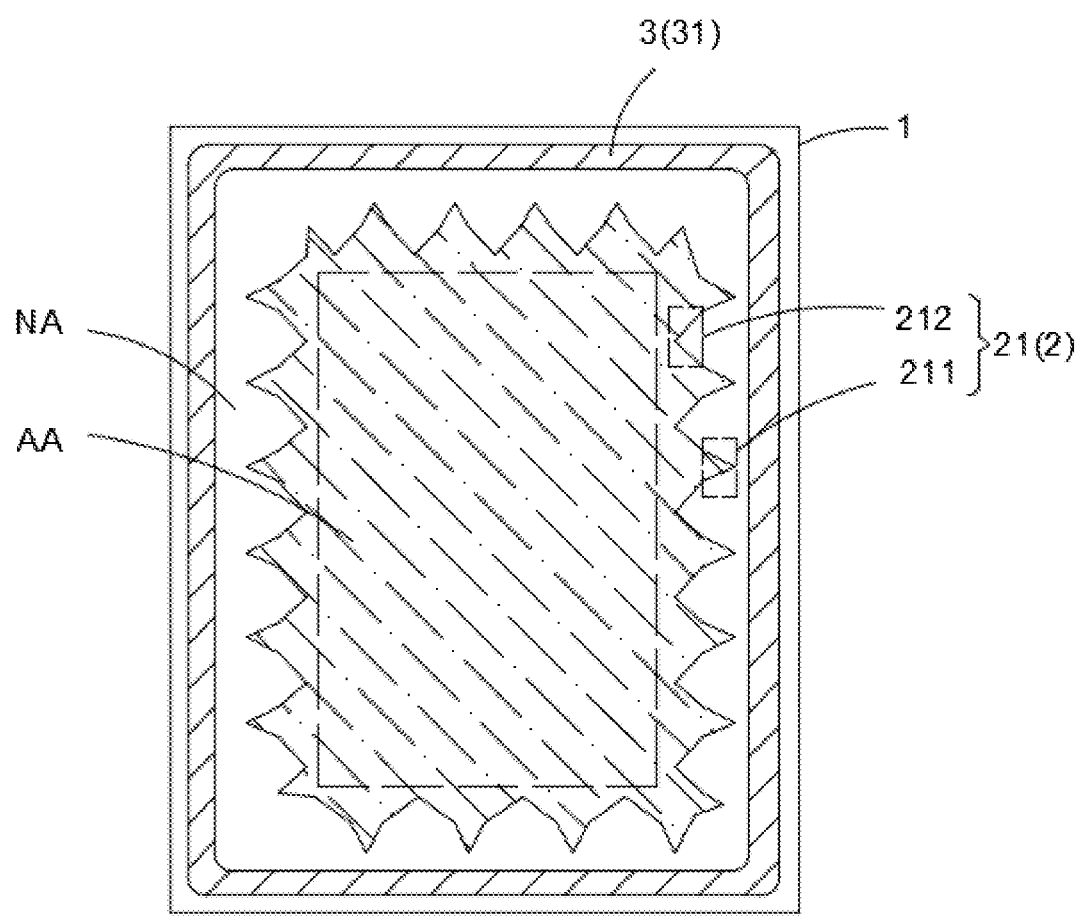
FIG. 4 illustrates a schematic structural diagram of another exemplary display panel according to various embodiments of the present disclosure.

FIG. 4 illustrates a schematic structural diagram of another exemplary display panel according to various embodiments of the present disclosure. Referring to FIGS. 1-4, in one embodiment, the extension trajectories of the first deformed portions 211 and the second deformed portions 212 may include at least one of curved lines and broken lines. For example, when the extension trajectories of the first deformed portions 211 and the second deformed portions 212 are broken lines, a zigzag shape may be adopted. As shown in FIG. 4, the first deformed portions 211 may adopt triangular zigzag lines pointing in the direction toward the metal pad layer 31, and the second deformed portions 212 may adopt triangular zigzag lines pointing in the direction away from the metal pad layer 31. At the same time, by limiting the side length of the second deformed portion 212 to be greater than the side length of the first deformed portion 211, the length c of the first deformed portion 211 may be less than or equal to the length d of the second deformed portion 212 in the extending direction Y of the first irregularly-shaped edge, thereby reducing the probability of evaporating the cathode layer 21 onto the metal pad layer 31. When the extension trajectories of the first deformed portions 211 and the second deformed portions 212 are curved lines, a semicircle or other arc shape may be adopted, as shown in FIG. 1, which is easy to shape. As such, the first deformed portion 211 and the second deformed portion 212 may have a smooth transition, and may not be easily broken.

In order to facilitate the shaping of the first irregularly-shaped edge, in some embodiments, the extension trajectories of the first deformed portions 211 and the second deformed portions 212 may both have arc shapes, and the curvature radius of the first deformed portion 211 may be smaller the curvature radius of the second deformed portion 212. It should be understood that the first deformed portion 211 may have an arc shape protruding toward the metal pad layer 31, and the second deformed portion 212 may have an arc shape protruding away from the metal pad layer 31. Since the curvature radius of the first deformed portion 211 is smaller than the curvature radius of the second deformed portion 212, the arrangement may be able to prevent the first deformed portion 211 from being too close to the metal pad layer 31, and thus make the second deformed portion 212 farther away from the metal pad layer 31. In addition, the arrangement may also be able to ensure that the length c of the first deformed portion 211 is smaller than the length d of the second deformed portion 212 in the extending direction Y of the first irregularly-shaped edge. That is, the arrangement may be able to ensure that the length d of the second deformed portion 212 that is far away from the metal pad layer 31 is greater than the length c of the first deformed portion 211 that is adjacent to the metal pad layer 31, e.g., the proportion of the second deformed portion 212 on the first irregularly-shaped edge may be larger. Even when an evaporation deviation exists, the evaporation material may be more likely to be evaporated between the second deformed portion 212 and the metal pad layer 31, instead of being evaporated onto the metal pad layer 31 opposite to the first deformed portion 211. Therefore, the possibility of evaporating the cathode layer 21 onto the metal pad layer 31 due to shadow effect and process deviation may be further reduced, and the packaging reliability of the encapsulation part 3 may be improved.

For example, the curvature radii of the first deformed portion 211 and the second deformed portion 212 may be greater than or equal to 0.1 mm to prevent the curvature radii of the first deformed portion 211 and the second deformed portion 212 from being too small and thus causing that the increase in the distance between the cathode layer 21 and the metal pad layer may not be obvious, and the risk of the cathode layer 21 being evaporated onto the metal pad layer 31 may not be effectively reduced.

Figure 5:
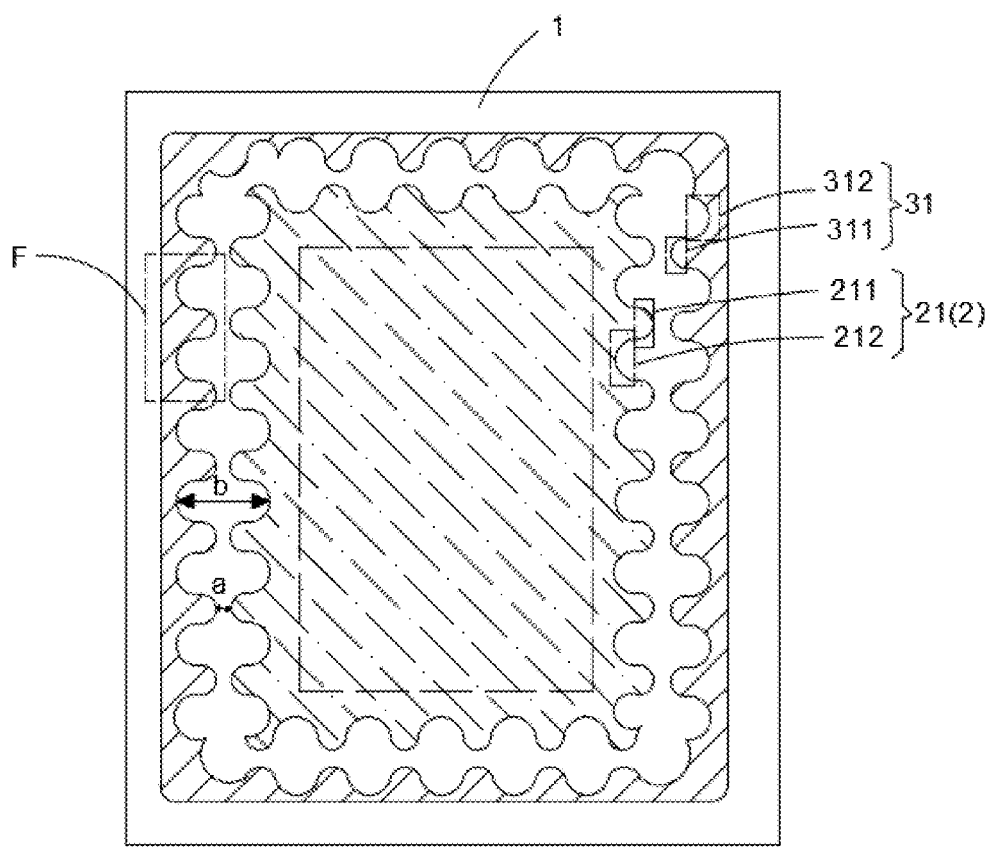
FIG. 5 illustrates a schematic structural diagram of another exemplary display panel according to various embodiments of the present disclosure.
Figure 6:
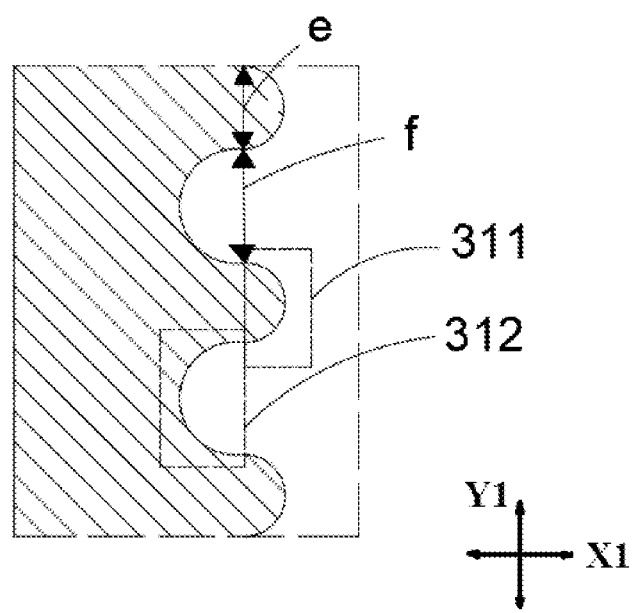
FIG. 6 illustrates an enlarged view of a part at F in FIG. 5.
Figure 7:
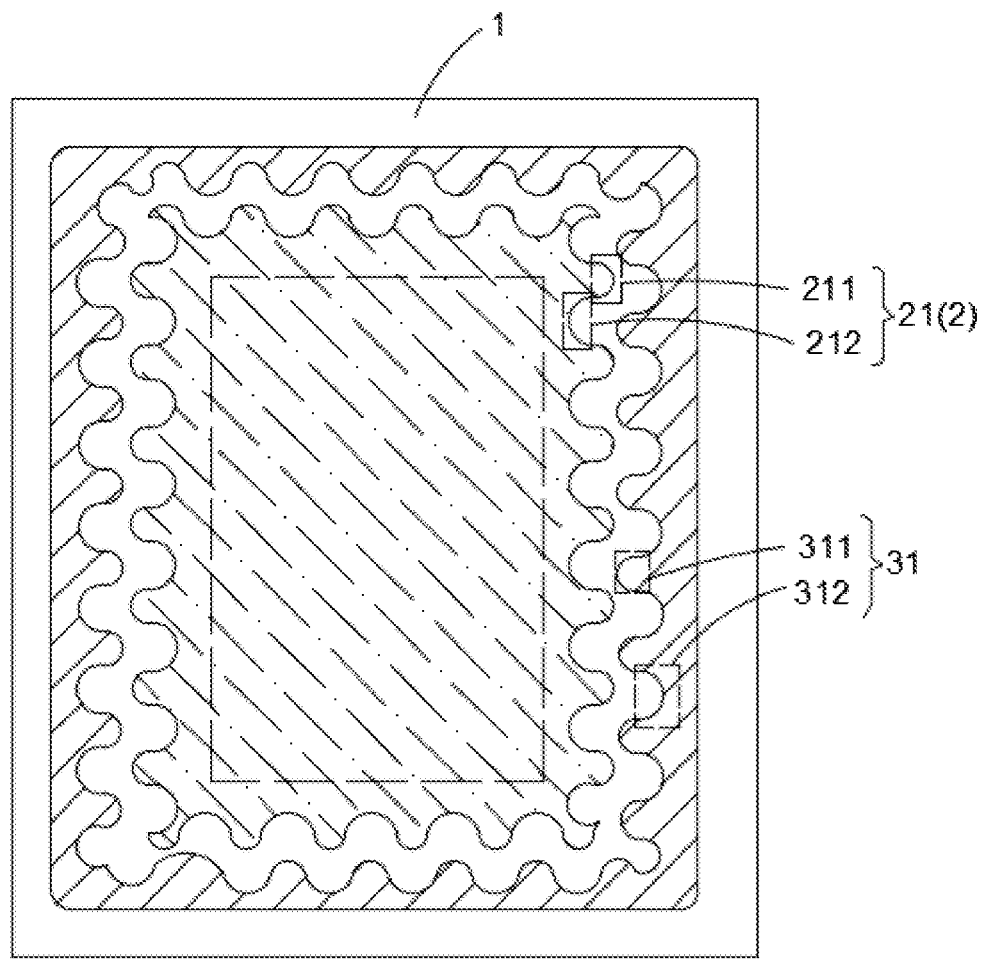
FIG. 7 illustrates a schematic structural diagram of another exemplary display panel according to various embodiments of the present disclosure.

FIG. 5 illustrates a schematic structural diagram of another exemplary display panel according to various embodiments of the present disclosure; FIG. 6 illustrates an enlarged view of a part at F in FIG. 5; and FIG. 7 illustrates a schematic structural diagram of another exemplary display panel according to various embodiments of the present disclosure. Referring to FIGS. 5-7, in order to further increase the distance between the metal pad layer 31 and the cathode layer 21, in some embodiments, the metal pad layer may have a second irregularly-shaped edge close to the cathode layer 21, and the second irregularly-shaped edge may have alternately distributed third deformed portions 311 and forth deformed portions 312. The third deformed portion 311 may extend convexly in the direction toward the cathode layer 21, and the fourth deformed portion 312 may extend concavely in the direction away from the cathode layer 21.

It should be noted that the second irregularly-shaped edge is the edge on the metal pad layer 31 opposite to the first irregularly-shaped edge of the cathode layer 21, and the distance from the second irregularly-shaped edge to the first irregularly-shaped edge is the distance between the metal pad layer 31 and the cathode layer 21. The metal pad layer 31 may be patterned to form the second irregularly-shaped edge having the third deformed portions 311 and the fourth deformed portions 312. For example, the third deformed portion 311 may extend convexly in the direction toward the cathode layer 21, and the fourth deformed portion 312 may extend concavely in the direction away from the cathode layer 21. That is, similar to the purpose of setting the first deformed portion 211 and the second deformed portion 212, in an X1 direction as shown in FIG. 6, the fourth deformed portion may extend concavely in the direction away from the cathode 21 to increase the distance between the cathode layer 21 and the metal pad layer 31, thereby avoiding evaporation of the material of the entire edge of the cathode layer 21 onto the metal pad layer 31.

In one embodiment, in the extending direction Y1 of the second irregularly-shaped edge, the length e of the third deformed portion 311 may be less than or equal to the length f of the fourth deformed portion 312. That is, the length f of the fourth deformed portion 312 that is relatively far away from the cathode layer 21 may be ensured to be larger than or equal to the length e of the third deformed portion 311 that is relatively closer to the cathode layer 21. As such, the possibility of evaporating the cathode layer 21 on the metal pad layer 31 due to the shadow effect and process deviation may be further reduced.

At the same time, the positions of the third deformed portion 311 and the fourth deformed portion 312 may also be matched with the positions of the first deformed portion 211 and the second deformed portion 212, thereby further increasing the distance between the first irregularly-shaped edge and the second irregularly-shaped edge and reducing the possibility of evaporating the cathode layer 21 onto the metal pad layer 31. For example, the second deformed portion 212 and the fourth deformed portion 312 may be arranged oppositely, because the second deformed portion 212 extends convexly away from the metal pad layer and the fourth deformed portion 312 extends convexly away from the cathode layer 21, that is, the second deformed portion 212 and the fourth deformed portion 312 respectively extend in directions opposite to each other, the distance between the second deformed portion 212 and the fourth deformed portion 312 may be further increased, thereby reducing the risk of evaporating the material of the entire edge of the cathode layer 21 onto the metal pad layer 31.

Referring to FIG. 5, in one embodiment, at least part of the first deformed portions 211 and the third deformed portions 311 may be arranged opposite to each other, and at least part of the second deformed portions 212 and the fourth deformed portions 312 may be arranged opposite to each other. The second deformed portion 212 and the fourth deformed portion 312 may respectively extend along directions opposite to each other, and thus further increasing the distance between the second deformed portion 212 and the fourth deformed portion 312. The relative positional relationship of the first deformed portion 211, the second deformed portion 212, the third deformed portion 311, and the fourth deformed portion 312 is not limited to the positional relationship described above, and may be designed according to the actual shapes and dimensions of the first irregularly-shaped edge and the second irregularly-shaped edge.

Referring to FIG. 7, in some embodiments, along the extending direction Y of the first irregularly-shaped edge, at least part of the first deformed portions 211 and the third deformed portions 311 may be arranged in a staggering manner, and at least part of the second deformed portions 212 and the fourth deformed portions 312 may be arranged in a staggering manner.

In the extending direction Y of the first irregularly-shaped edge, at least part of the first deformed portions 211 and the third deformed portions 311 may be arranged in a staggering manner, and at least part of the second deformed portions 212 and the fourth deformed portions 312 may be arranged in a staggering manner. It should be understood that arranging the convexly extending directions of the first deformed portion 211 and the third deformed portion 311 opposite to each other, and arranging the first deformed portion 211 and the third deformed portion 311 in a staggering manner may effectively prevent interference between the first deformed portion 211 and the third deformed portion 311. Similarly, arranging the second deformed portion 212 and the fourth deformed portion 312 in a staggering manner, that is, arranging the first deformed portion 211 and the fourth deformed portion 312 opposite to each other and the second deformed portion 212 and the third deformed portion 311 opposite to each other, may ensure that the distance between the first deformed portion 211 and the fourth deformed portion 312 and the distance between the second deformed portion 212 and the third deformed portion 311 are sufficiently large.

In some embodiments, referring to FIG. 5, in order to make at least part of the first deformed portions 211 and the third deformed portions disposed opposite to each other and at least part of the second deformed portions 212 and the fourth deformed portions 312 are disposed opposite to each other, the first deformed portion 211, the second deformed portion 212, the third deformed portion 311, and the fourth deformed portion 312 may all have arc shapes. In addition, the curvature radius of the first deformed portion 211 may be equal to the curvature radius of the third deformed portion 311, and the curvature radius of the second deformed portion 212 may be equal to the curvature radius of the fourth deformed portion 312.

It should be understood that when the first deformed portion 211, the second deformed portion 212, the third deformed portion 311, and the fourth deformed portion 312 are all arc-shaped, the curvature radius of the first deformed portion 211 and the curvature radius of the third deformed portion 311 may equal each other, and in the convexly extending direction of the first deformed portion 211, the first deformed portion 211 and the third deformed portion 311 may be mirror symmetrical. Similarly, the curvature radius of the second deformed portion 212 and the curvature radius of the fourth deformed portion 312 may equal each other, and the second deformed portion 212 and the fourth deformed portion 312 may be mirror symmetrical. As such the uniformity of the distance variation between the first irregularly-shaped edge and the second irregularly-shaped edge may be improved, thereby preventing a portion of the material of the cathode layer 21 from being evaporated onto the metal pad layer 31 due to different distances at different locations between the first irregularly-shaped edge and the second irregularly-shaped edge.

Due to process limitations, in some embodiments, the curvature radii of the first deformed portion 211 and the second deformed portion 212 may be greater than or equal to 0.1 mm, and the curvature radii of the third deformed portion 311 and the fourth deformed portion 312 may be greater than or equal to 0.03 mm. For example, when the third deformed portion 311 and the fourth deformed portion 312 adopt a semicircular shape and the curvature radii of the third deformed portion 311 and the fourth deformed portion 312 are both equal to 0.03 mm, the maximum distance from the second irregularly-shaped edge of the metal pad layer 31 opposite to the cathode layer 21 to the first irregularly-shaped edge of the cathode layer 21 may be increased by at least 0.03 mm as compared to the maximum distance when straight lines are used for the opposite edges of metal pad layer 31 and the cathode layer 21. That is, the increase in the maximum distance may be at least the curvature radius of the third deformed portion.

Referring to FIG. 3, in order to facilitate the transmission of the cathode voltage signal PVEE to the cathode layer 21, in some embodiments, the display panel may further include a cathode signal line layer 5 and a metal connection layer 4 that are stacked in sequence on the base substrate 1 along the light exiting direction of the display panel. The cathode signal line layer 5 and the metal connection layer 4 may be located on the same side of the base substrate 1 as the device layer 2. In the direction perpendicular to the plane of the base substrate 1, the cathode layer 21 may at least partially cover the metal connection layer 4, and the metal connection layer 4 may be electrically connected to the cathode layer 21 and the cathode signal line layer 5.

It should be noted that the cathode voltage signal line of the cathode signal line layer 5 may be electrically connected to a control chip for transmitting the cathode voltage signal PVEE sent by the control chip, which may be limited by the internal space and the wiring of the display panel. In one embodiment, the metal connection layer 4 may be used to transmit the cathode voltage signal PVEE to the cathode layer 21.

It should be noted that PVEE refers to Pixel VEE, where Pixel represents pixel of the display panel, and VEE represents a negative voltage. Therefore, PVEE represents providing a negative voltage to the cathode layer 21.

In one embodiment, the metal connection layer 4 may be prepared separately or together with the anode layer 24 of the display region AA. For example, because the anode layer 24 is generally made of metal materials such as titanium, aluminum, etc., when preparing the anode layer 24, the metal connection layer 4 may be simultaneously formed in the non-display region NA, that is, the metal connection layer and the anode layer 24 may be made of a same material. It should be noted that the metal connection layer 4 and the anode layer 24 may need to be insulated to avoid problems such as forming a short circuit therein between. For example, the pixel defining layer 22 may be used for insulation. The pixel defining layer 22 may be made of an inorganic insulating material such as silicon nitride, silicon oxide, etc.

Figure 8:
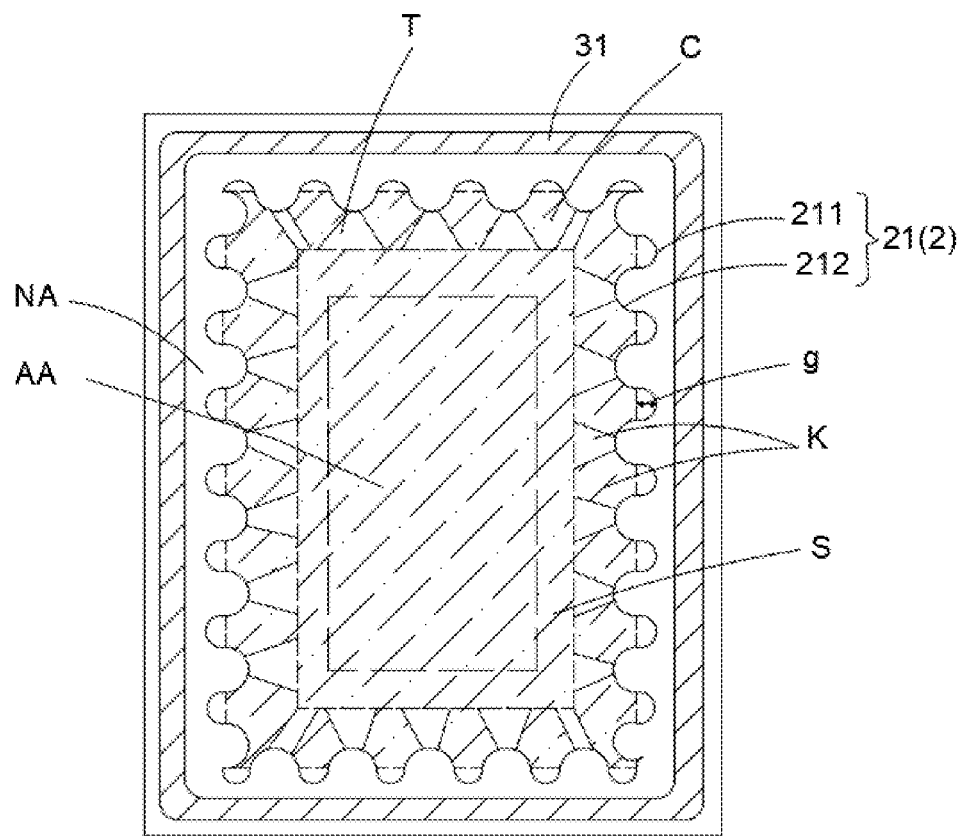
FIG. 8 illustrates a schematic structural diagram of another exemplary display panel according to various embodiments of the present disclosure.
Figure 9:
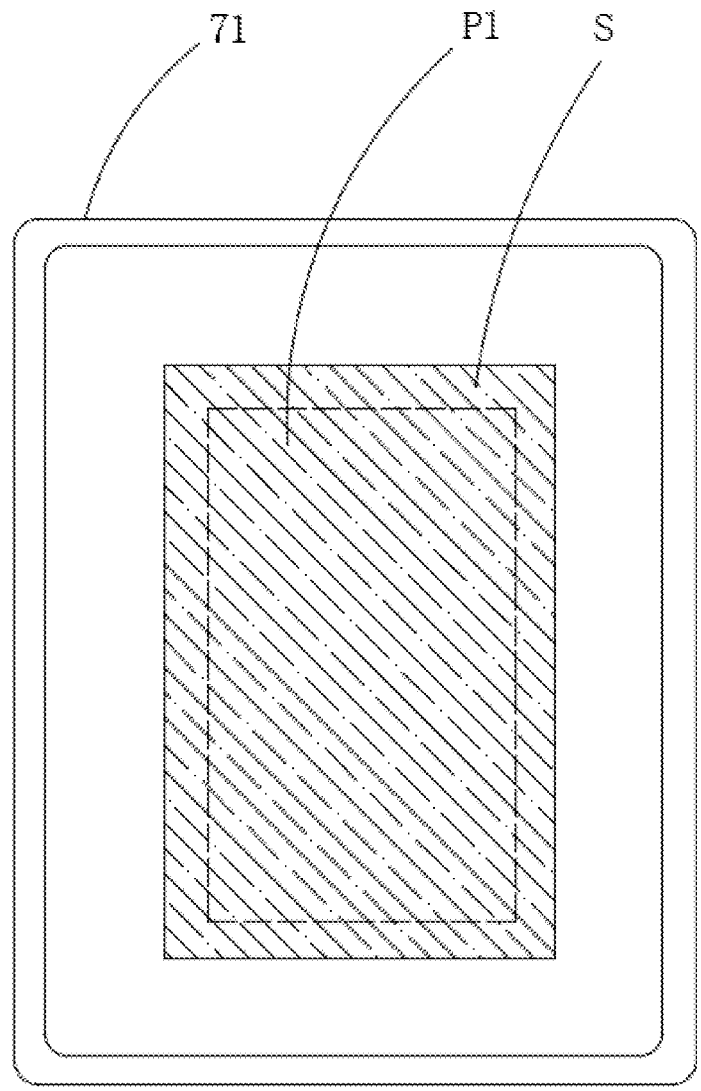
FIG. 9 illustrates a schematic diagram of a first mask according to various embodiments of the present disclosure.

FIG. 8 illustrates a schematic structural diagram of another exemplary display panel according to various embodiments of the present disclosure, and FIG. 9 illustrates a schematic diagram of a first mask according to various embodiments of the present disclosure. Referring to FIGS. 3, and 8-9, in some embodiments, the region defined by the contact portion of the cathode layer 21 and the metal connection layer 4 may be a contact region C, e.g., the region between two adjacent dotted lines pointed by C in FIG. 8. In one embodiment, the maximum distance g from the first deformed portion 211 to the contact region C may be less than or equal to 10 μm, and the second deformed portion 212 may be located in the contract region C. In other embodiments, the second deformed portion 212 may be located outside the contact region C.

It should be noted that the cathode layer 21 may at least partially cover the metal connection layer 4, the cathode layer 21 may cover a portion of the metal connection layer 4, e.g., the portion where the cathode layer 21 and the metal connection layer are electrically connected. The region defined by the contact portion of the cathode layer 21 and the metal connection layer 4 may be the contact region C. That is, the contact region C may be the region defined by the portion where the cathode layer 21 directly covers the metal connection layer 4, e.g., the electrical contact region between the cathode layer 21 and the metal connection layer 4.

In one embodiment, in order to achieve electrical connection between the cathode layer 21 and the metal connection layer 4, a corresponding slot H may be provided on the pixel defining layer 22 between the cathode layer 21 and the metal connection layer 4, so that the cathode layer 21 and the metal connection layer 4 may be in contact with each other. The outer edge of the slot H opposite to the metal pad layer 31 may also adopt a concave-convex shape corresponding to the first irregularly-shaped edge of the cathode layer 21.

In order to prevent the first irregularly-shaped edge of the cathode layer 21 from affecting the contact between the cathode layer 21 and the metal connection layer 4, the maximum distance g between the first deformed portion 211 and the contact region C may be less than or equal to 10 μm. that is, the first deformed portion 211 may extend out relative to the contact region C (e.g., the edge of the first deformed portion 211 may be closer to the metal pad layer 31 relative to the outer edge of the contact region C). However, the first deformed portion 211 may not extend excessively out relative to the contact region C. At the same time, the second deformed portion 212 may be located in the contact region C, and thus may not affect the electrical connection and the contact between the cathode layer 21 and the metal connection layer 4.

It should be understood that when the cathode layer 21 covers the metal connection layer 4, the shape of the contact region C relative to the edge of the metal pad layer 31 may be the same as the shape of the metal connection layer 4 relative to the edge of the metal pad layer 31. The edge shape of the metal connection layer 4 relative to the metal pad layer 31 may be a straight line, or a irregularly-shaped edge similar to the first irregularly-shaped edge, so as to increase the contact region between the metal connection layer 4 and the cathode layer 21, and thus improve the transmission effect of the cathode voltage signal PVEE.

In some embodiments, as shown in FIG. 5, the minimum distance between the first irregularly-shaped edge and the second irregularly-shaped edge may be a, where 10 μm≤a≤150 μm. at the same time, the maximum distance between the first irregularly-shaped edge and the second irregularly-shaped edge may be b, where 50 μm≤b≤200 μm. By limiting the maximum distance between the first irregularly-shaped edge and the second irregularly-shaped edge, the frame of the display panel may be ensured to be not too wide, and thus a narrow frame can be achieved. In addition, limiting the minimum distance between the first irregularly-shaped edge and the second irregularly-shaped edge may be able to ensure that the cathode layer 21 will not be too close to the metal pad layer 31, thereby preventing part of the material of the cathode layer 21 from being evaporated onto the metal pad layer 31 when forming the cathode layer 21 through evaporation. When part of the material of the cathode layer is evaporated onto the metal pad layer 31, the packaging effect of the display panel may be affected. That is, while ensuring that the frame of the display panel is as narrow as possible, it is also necessary to ensure that the material of the cathode layer 21 evaporated onto the metal pad layer 31 is as less as possible.

Referring to FIG. 8, in order to reduce the distribution region of the shadow, in some embodiments, the cathode layer 21 may have a patterned region K. The patterned region K may be provided at the edge of the cathode layer 21 adjacent to the metal pad layer 31, and the cathode layer 21 located in the patterned region K may have a plurality of openings T.

It should be noted that in order to have a plurality of openings T on the edge of the cathode layer 21 and form the patterned region K, the mask used for the evaporation of the cathode layer 21 may need to have a patterned opening region corresponding to the patterned region K of the cathode layer 21, and the plurality of openings T may be correspondingly arranged in this region.

Figure 10:
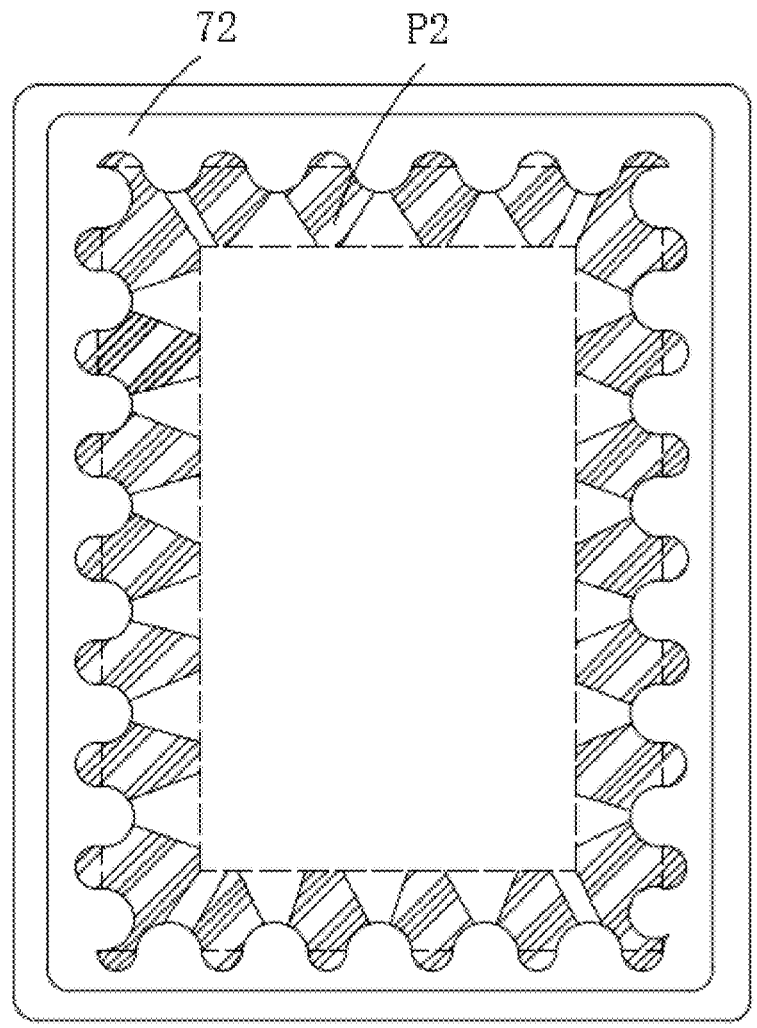
FIG. 10 illustrates a schematic diagram of a second mask according to various embodiments of the present disclosure.

FIG. 10 illustrates a schematic diagram of a second mask according to various embodiments of the present disclosure. Referring to FIGS. 9-10, in one embodiment, in order to form the patterned region K, two masks 7, e.g., a first mask 71 and a second mask 72, can be produced. The first mask 71 may be provided with a central opening P1 in the center, e.g., the shaded region in FIG. 9, which corresponds to the portion of the cathode layer 21 located in the display region AA. In one example, the central opening P1 may extend beyond the display region AA by approximately 100 μm to 200 μm to correspond to the non-patterned portion S of the cathode layer 21 in the non-display region. When the first mask 71 having a large central opening P1 is used to make the portion of the cathode layer 21 in the inner region, even being affected by the shadow effect during evaporation, because the edge of the portion of the cathode layer 21 is still far away from the edge of the metal pad layer 31, the material of the cathode layer 21 may still not be deposited onto the metal pad layer 31. The second mask 72 may be provided with an annular patterned opening P2, e.g., the shaded region in FIG. 10, which corresponds to the portion of the patterned region K of the cathode layer 21 located at the periphery of the display region AA. That is, the second mask 72 may be used to form the part of the cathode layer 21 located in the edge region. Therefore, the entire cathode layer 21 having the patterned region K may be formed by two-step evaporation using the first mask 71 and the second mask 72. Since the openings on the second mask 72 are a plurality of unconnected small openings, each small opening may be much smaller than the central opening P1. When forming the first irregularly-shaped edge of the cathode layer 21 by evaporation, the shadow effect may have less impact, and thus the material of the cathode layer 21 may be more difficult to be evaporated onto the metal pad layer 31. Of course, the forming process of the cathode layer 21 is not limited to the description provided above, and may be selected according to actual conditions.

It should be understood that the patterned region K is provided at the edge of the cathode layer 21 adjacent to the metal pad layer 31, which can effectively prevent the patterned region K from affecting the contact between the cathode layer 21 and the metal connection layer 4 and the normal signal transmission effect of the cathode layer 21.

In one embodiment, an orthogonal projection of the plurality of openings T in the patterned region K on the base substrate 1 may cover approximately ¼ to ½ of an orthogonal projection of the contact region C on the base substrate 1. The area of each opening T on the patterned region K should not be too large. An overly large area of an opening T on the patterned region K may easily affect the signal transmission effect between the cathode layer 21 and the metal connection 4. The area of each opening T on the patterned region K may not be too small. When the area of an opening T is too small, the shadow effect may not be effectively reduced.

In some embodiments, the plurality of openings T may have at least one of a polygonal shape, a circular shape, and an oval shape. The shape of each opening T is not specifically limited to any shape, and can be selected according to the actual production process.

In order to avoid that overly large openings affect the strength of the edge structure of the cathode layer 21, in some embodiments, the maximum distance between two points on the edge of the opening T may be in a range of approximately 30 µm to 50 µm. It should be noted that the maximum distance between two points on the edge of the opening T is the maximum size of the opening. For example, when the opening T has a circular shape, the maximum distance between two points on the edge of the opening T may be the dimension of the diameter of the circle. The opening T may not be opened too large. Otherwise, an overly large opening may not only affect the strength of the edge structure of the cathode layer 21 but also affect the electrical connection between the cathode layer 21 and the metal connection layer 4.

Figure 11:
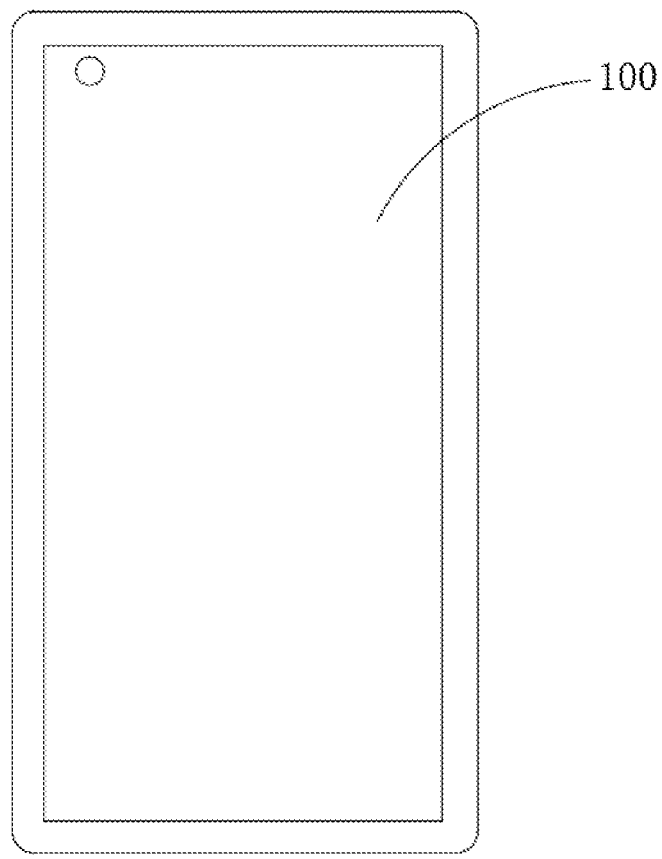
FIG. 11 illustrates a schematic structural diagram of an exemplary display device according to various embodiments of the present disclosure.

The present disclosure also provides a display device. FIG. 11 illustrates a schematic structural diagram of an exemplary display device according to various embodiments of the present disclosure. Referring to FIG. 11, the display device may include a display panel 100 consistent with various embodiments of the present disclosure. Therefore, the display device provided by the present disclosure may have the technical features of the technical solutions in any of the embodiments described above, and the structure and the explanation of terms are the same as or correspond to those in the embodiments described above, which are not repeated here.

The display device provided by various embodiments of the present disclosure may be a mobile phone or any electronic product with display function, including but not limited to the following categories: televisions, notebook computers, desktop displays, tablet computers, digital cameras, smart bracelets, smart glasses, on-board displays, medical equipment, industrial control equipment, touch interactive terminals, etc. which are not particularly limited by the embodiments of the present disclosure.

It should also be noted that the exemplary embodiments provided in the present disclosure describe some methods or systems based on a series of steps or devices. However, the present disclosure is not limited to the order of the above steps. That is, the steps may be executed in the order described in the embodiments, or may be executed different from the order described in the embodiments. Alternatively, several steps may be executed at the same time.

It should be noted that the above are only some embodiments of the present disclosure and the applied technical principles. Those skilled in the art shall understand that the present disclosure is not limited to the specific embodiments described herein, and various obvious changes, readjustments, combinations and substitutions can be made without departing from the protection scope of the present disclosure. Therefore, although the present disclosure has been described in detail through the above embodiments, the present disclosure is not limited to the above embodiments, and can also include other equivalent embodiments without departing from the principle of the present disclosure. Any equivalent or modification thereof, without departing from the spirit and principle of the present disclosure, falls within the true scope of the present disclosure.

What is claimed is:

1. A display panel, including a display region and a non-display region surrounding the display region, and comprising:
   a base substrate including a first surface and an opposite second surface;
   a device layer, disposed on one side of the base substrate away from the second surface, covering the display region, and including a cathode layer; and
   an encapsulation part, arranged around the device layer in the non-display region and including a metal pad layer surrounding the cathode layer, wherein:
   the metal pad layer and the cathode layer are separated by a gap;
   the cathode layer has a first irregularly-shaped edge, including first deformed portions and second deformed portions that are alternately distributed;
   each first deformed portion extends convexly in a direction toward the metal pad layer, and each second deformed portion extends concavely in a direction away from the metal pad layer; and
   in an extending direction of the first irregularly-shaped edge, a length of the first deformed portion is less than or equal to a length of the second deformed portion; and
   the metal pad layer extends along the extending direction of the first irregularly-shaped edge and is disposed over and adjacent the first surface of the base substrate on a side of the base substrate away from the second surface.

2. The display panel according to claim 1, wherein:
   a length of the first deformed portion extending toward the meal pad layer is less than or equal to a length of the second deformed portion extending away from the metal pad layer.

3. The display panel according to claim 1, wherein:
   extension trajectories of the first deformed portions and the second deformed portions include at least one of curved lines and broken lines.

4. The display panel according to claim 3, wherein:
   the extension trajectories of the first deformed portions and the second deformed portions both have arc shapes, and a curvature radius of the first deformed portion is smaller than a curvature radius of the second deformed portion.

5. The display panel according to claim 4, wherein:
   the curvature radius of the first deformed portion and the curvature radius of the second deformed portion are greater than or equal to 0.1 mm.

6. The display panel according to claim 1, further including:
   a cathode signal line layer and a metal connection layer that are stacked in sequence on the base substrate along a light exiting direction of the display panel, wherein:
   the cathode signal line layer and the metal connection layer are located on a same side of the base substrate as the device layer;
   in a direction perpendicular to a plane of the base substrate, the cathode layer at least partially covers the metal connection layer; and the metal connection layer is electrically connected to the cathode layer and the cathode signal line layer, respectively.

7. A display panel, including a display region and a non-display region surrounding the display region, and comprising:
a base substrate;
a device layer, disposed on one side of the base substrate, covering the display region, and including a cathode layer; and
an encapsulation part, arranged around the device layer in the non-display region and including a metal pad layer surrounding the cathode layer, wherein:
the metal pad layer and the cathode layer are separated by a gap;
the cathode layer has a first irregularly-shaped edge, including first deformed portions and second deformed portions that are alternately distributed;
each first deformed portion extends convexly in a direction toward the metal pad layer, and each second deformed portion extends concavely in a direction away from the metal pad layer; and
in an extending direction of the first irregularly-shaped edge, a length of the first deformed portion is less than or equal to a length of the second deformed portion, wherein
the metal pad layer has a second irregularly-shaped edge close to the cathode layer, the second irregularly-shaped edge including third deformed portions and fourth deformed portions that are alternately distributed; and
each third deformed portion extends convexly in a direction toward the cathode layer, and each fourth deformed portion extends concavely in a direction away from the cathode layer.

8. The display panel according to claim 7, wherein:
in an extending direction of the first irregularly-shaped edge, at least part of the first deformed portions and the third deformed portions are arranged in a staggering manner, and at least part of the second deformed portions and the fourth deformed portions are arranged in a staggering manner.

9. The display panel according to claim 7, wherein:
at least part of the first deformed portions and the third deformed portions are arranged opposite to each other, and at least part of the second deformed portions and the fourth deformed portions are arranged opposite to each other.

10. The display panel according to claim 9, wherein:
the first deformed portions, the second deformed portions, the third deformed portions, and the fourth deformed portions are all arc-shaped;
a curvature radius of the first deformed portion is equal to a curvature radius of the third deformed portion; and
a curvature radius of the second deformed portion is equal to a curvature radius of the fourth deformed portion.

11. The display panel according to claim 7, wherein:
a curvature radius of the third deformed portion and a curvature radius of the fourth deformed portion are greater than or equal to 0.03 mm.

12. The display panel according to claim 11, wherein:
a region defined by a contact portion of the cathode layer and the metal connection layer is a contact region;
a maximum distance from the first deformed portion to the contact region is less than or equal to 10 µm; and
the second deformed portion is located in the contact region.

13. The display panel according to claim 12, wherein:
a minimum distance between the first irregularly-shaped edge and the second irregularly-shaped edge is a, wherein 10 µm≤a≤150 µm.

14. The display panel according to claim 12, wherein:
a maximum distance between the first irregularly-shaped edge and the second irregularly-shaped edge is b, wherein 50 µm≤b≤200 µm.

15. The display panel according to claim 12, wherein:
the cathode layer includes a patterned region;
the patterned region is provided at an edge of the cathode layer adjacent to the metal pad layer; and
the cathode layer located in the patterned region includes a plurality of openings.

16. The display panel according to claim 15, wherein:
the plurality of openings has at least one of a polygonal shape, a circular shape, and an oval shape.

17. The display panel according to claim 15, wherein:
a maximum distance between two points on an edge of each opening is in a range of approximately 30 µm to 50 µm.

18. The display panel according to claim 15, wherein:
an orthogonal projection of the plurality of openings in the patterned region on the base substrate covers approximately ¼ to ½ of an orthogonal projection of the contact region on the base substrate.

19. A display device, comprising:
a display panel, including a display region and a non-display region surrounding the display region and including:
a base substrate including a first surface and an opposite second surface;
a device layer, disposed on one side of the base substrate away from the second surface, covering the display region, and including a cathode layer; and
an encapsulation part, arranged around the device layer in the non-display region and including a metal pad layer surrounding the cathode layer, wherein:
the metal pad layer and the cathode layer are separated by a gap;
the cathode layer has a first irregularly-shaped edge, including first deformed portions and second deformed portions that are alternately distributed;
each first deformed portion extends convexly in a direction toward the metal pad layer, and each second deformed portion extends concavely in a direction away from the metal pad layer;
in an extending direction of the first irregularly-shaped edge, a length of the first deformed portion is less than or equal to a length of the second deformed portion; and
the metal pad layer extends along the extending direction of the first irregularly-shaped edge and is disposed over and adjacent the first surface of the base substrate on a side of the base substrate away from the second surface.

20. The display device according to claim 19, wherein:
a length of the first deformed portion extending toward the meal pad layer is less than or equal to a length of the second deformed portion extending away from the metal pad layer.

* * * * *